(12) United States Patent
Wang et al.

(10) Patent No.: US 8,823,065 B2
(45) Date of Patent: Sep. 2, 2014

(54) CONTACT STRUCTURE OF SEMICONDUCTOR DEVICE

(71) Applicant: Taiwan Semiconductor Manufacturing Company, Ltd., Hsin-Chu (TW)

(72) Inventors: Sung-Li Wang, Zhubei (TW);
Ding-Kang Shih, New Taipei (TW);
Chin-Hsiang Lin, Hsin-Chu (TW);
Sey-Ping Sun, Hsin-Chu (TW);
Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/672,258

(22) Filed: Nov. 8, 2012

(65) Prior Publication Data
US 2014/0124842 A1 May 8, 2014

(51) Int. Cl.
*H01L 29/417* (2006.01)
*H01L 29/43* (2006.01)
*H01L 29/45* (2006.01)

(52) U.S. Cl.
USPC ........... 257/288; 257/742; 257/743; 257/744; 257/745; 257/758; 257/E29.121; 257/E29.139; 257/E29.144

(58) Field of Classification Search
USPC ......... 257/288, 741, 742, 743, 744, 745, 758, 257/E29.116, E29.121, E29.139, E29.144, 257/E29.164
See application file for complete search history.

(56) References Cited

U.S. PATENT DOCUMENTS

| | | | |
|---|---|---|---|
| 6,878,606 B2 * | 4/2005 | Ohnishi et al. | 438/424 |
| 8,110,877 B2 * | 2/2012 | Mukherjee et al. | 257/365 |
| 2005/0032327 A1 * | 2/2005 | Ohnishi et al. | 438/424 |
| 2008/0157224 A1 | 7/2008 | Fischer et al. | |
| 2010/0155846 A1 | 6/2010 | Mukherjee et al. | |
| 2010/0197092 A1 | 8/2010 | Kim et al. | |
| 2010/0276810 A1 | 11/2010 | Chang et al. | |
| 2011/0079829 A1 | 4/2011 | Lai et al. | |
| 2012/0049201 A1 * | 3/2012 | Yamaguchi et al. | 257/77 |
| 2012/0068273 A1 * | 3/2012 | Fischer et al. | 257/369 |
| 2013/0214363 A1 * | 8/2013 | Nemouchi et al. | 257/369 |
| 2013/0260518 A1 * | 10/2013 | Buss | 438/199 |

FOREIGN PATENT DOCUMENTS

| | | |
|---|---|---|
| KR | 20100088905 | 8/2010 |
| KR | 20110036505 | 4/2011 |
| KR | 20110084166 | 7/2011 |

* cited by examiner

*Primary Examiner* — Victor A Mandala
(74) *Attorney, Agent, or Firm* — Slater and Matsil, L.L.P.

(57) ABSTRACT

The invention relates to a contact structure of a semiconductor device. An exemplary structure for a contact structure for a semiconductor device comprises a substrate comprising a major surface and a trench below the major surface; a strained material filling the trench, wherein a lattice constant of the strained material is different from a lattice constant of the substrate; an inter-layer dielectric (ILD) layer having an opening over the strained material, wherein the opening comprises dielectric sidewalls and a strained material bottom; a semiconductor layer on the sidewalls and bottom of the opening; a dielectric layer on the semiconductor layer; and a metal layer filling an opening of the dielectric layer.

16 Claims, 12 Drawing Sheets

CONTACT STRUCTURE OF SEMICONDUCTOR DEVICE

TECHNICAL FIELD

This disclosure relates to integrated circuit fabrication, and more particularly to a semiconductor device with a contact structure.

BACKGROUND

As the semiconductor industry has progressed into nanometer technology process nodes in pursuit of higher device density, higher performance, and lower costs, challenges from both fabrication and design issues have resulted in the development of three-dimensional designs of a semiconductor device, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over three sides (e.g., wrapping) the fin. Having a gate on both sides of the channel allows gate control of the channel from both sides. Further advantages of FinFET comprise reducing the short channel effect and higher current flow.

However, there are challenges to implementation of such features and processes in complementary metal-oxide-semiconductor (CMOS) fabrication. For example, silicide formation on strained materials causes high contact resistance of source/drain regions of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
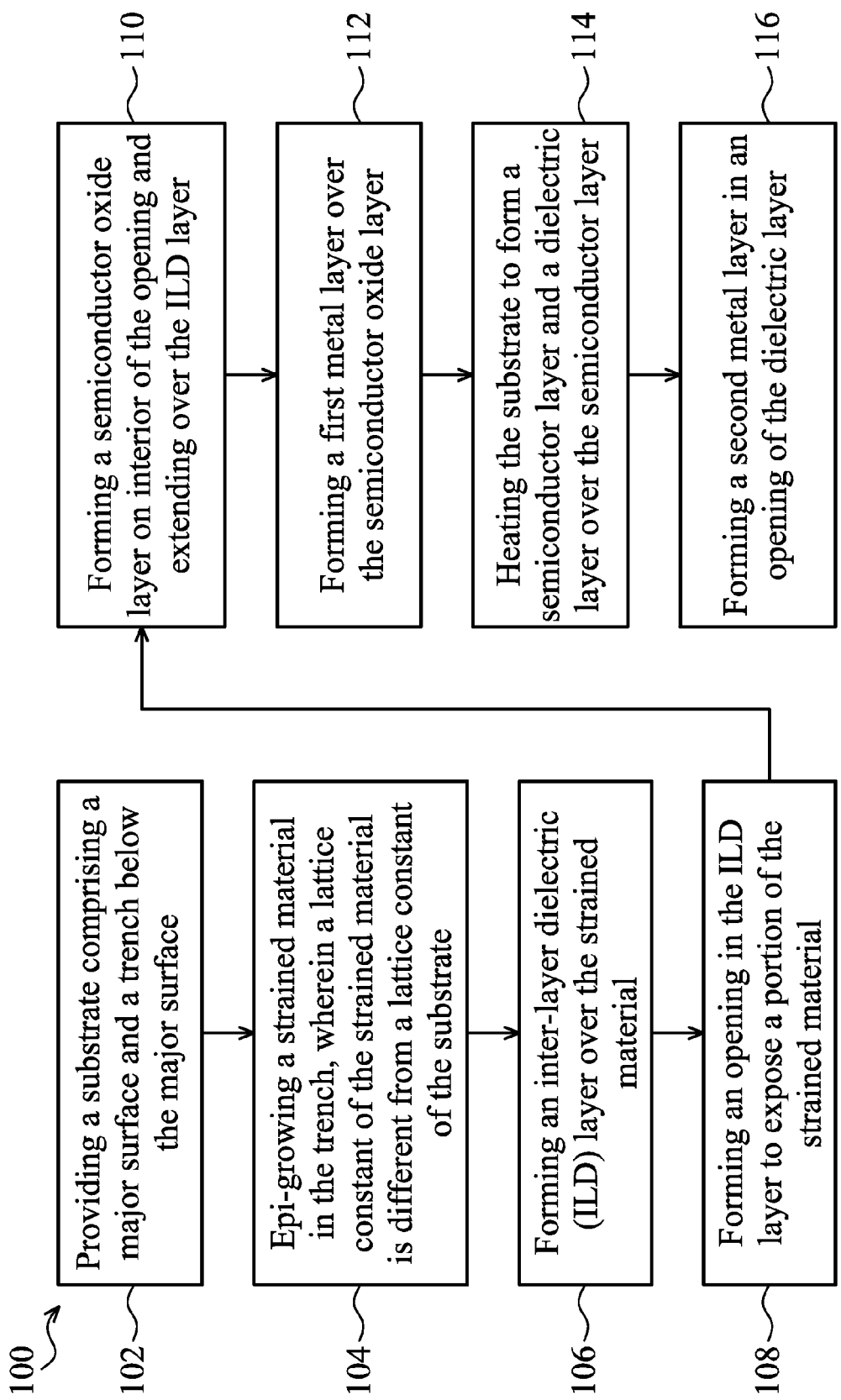
FIG. 1 is a flowchart illustrating a method of fabricating a contact structure of a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a contact structure of a semiconductor device according to various aspects of the present disclosure. The method 100 begins with step 102 in which a substrate comprising a major surface and a trench below the major surface is provided. The method 100 continues with step 104 in which a strained material is epi-grown in the trench, wherein a lattice constant of the strained material is different from a lattice constant of the substrate. The method 100 continues with step 106 in which an inter-layer dielectric (ILD) layer is formed over the strained material. The method 100 continues with step 108 in which an opening is formed in the ILD layer to expose a portion of the strained material. The method 100 continues with step 110 in which a semiconductor oxide layer is formed on interior of the opening and extending over the ILD layer. The method 100 continues with step 112 in which a first metal layer is formed over the semiconductor oxide layer. The method 100 continues with step 114 in which the substrate is heated to form a semiconductor layer and a dielectric layer over the semiconductor layer. The method 100 continues with step 116 in which a second metal layer is formed in an opening of the dielectric layer. The discussion that follows illustrates embodiments of semiconductor devices that can be fabricated according to the method 100 of FIG. 1.

FIGS. 2-12 are schematic cross-sectional views of a semiconductor device 200 comprising a contact structure 234 at various stages of fabrication according to various aspects of the present disclosure. As employed in the present disclosure, the term semiconductor device 200 refers to a fin field effect transistor (FinFET). The FinFET refers to any fin-based, multi-gate transistor. In some alternative embodiments, the term semiconductor device 200 refers to a planar metal-oxide-semiconductor field effect transistor (MOSFET). Other transistor structures and analogous structures are within the contemplated scope of this disclosure. The semiconductor device 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 12 are simplified for a better understanding of the concepts of the present disclosure. For example, although the figures illustrate the semiconductor device 200, it is understood the IC may comprise a number of other devices comprising resistors, capacitors, inductors, fuses, etc.

Figure 2:
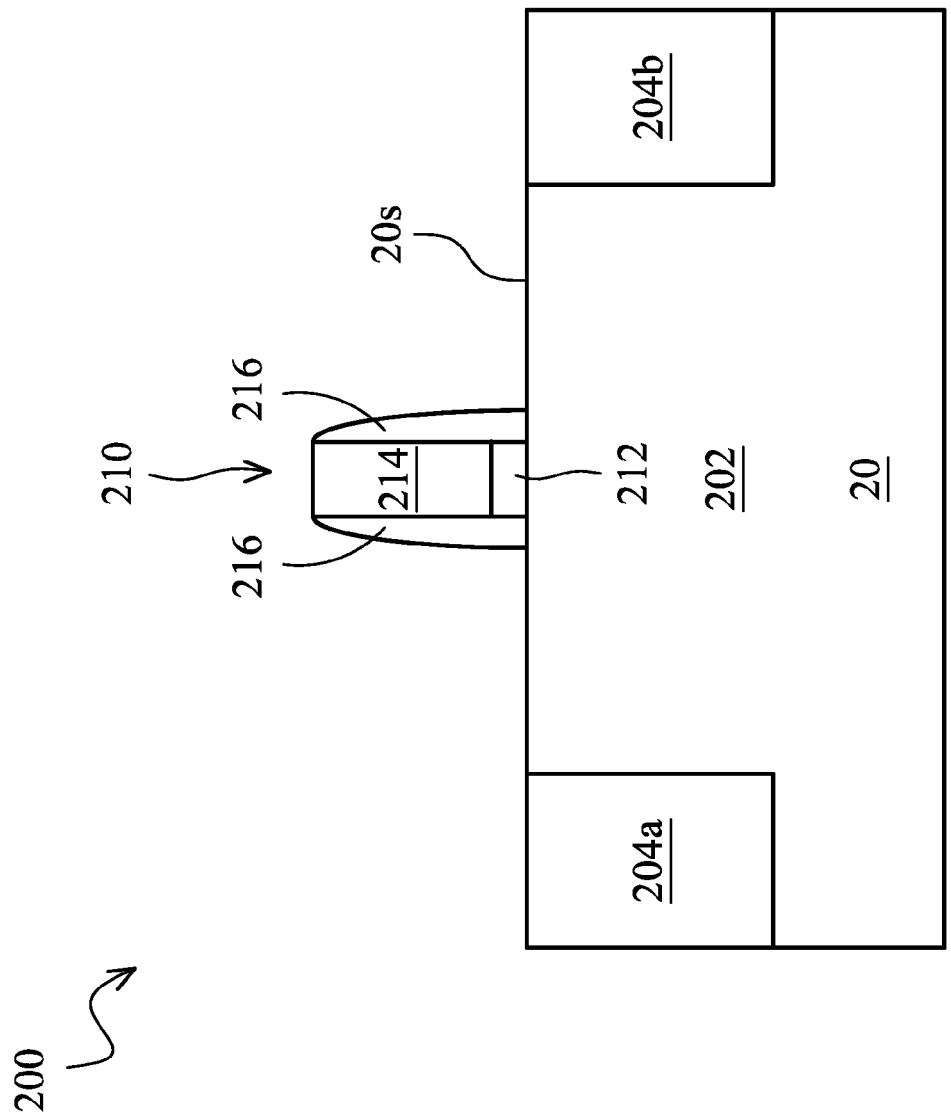
FIGS. 2-12 are schematic cross-sectional views of a semiconductor device comprising a contact structure at various stages of fabrication according to various aspects of the present disclosure.

Referring to FIG. 2 and step 102 in FIG. 1, a substrate 20 comprising a major surface 20s is provided. In at least one embodiment, the substrate 20 comprises a crystalline silicon substrate (e.g., wafer). The substrate 20 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET or planar MOSFET, or alternatively configured for a p-type FinFET or planar MOSFET.

The substrate 20 may alternatively be made of some other suitable elementary semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 20 may include an epitaxial layer (epi-layer), may be strained for performance enhancement, and/or may include a silicon-on-insulator (SOI) structure.

In the depicted embodiment, the substrate 20 further comprises a fin structure 202. The fin structure 202, formed on the substrate 20, comprises one or more fins. In the present embodiment, for simplicity, the fin structure 202 comprises a single fin. The fin comprises any suitable material, for example, the fin may comprise silicon, germanium or compound semiconductor. The fin structure 202 may further comprise a capping layer (not shown) disposed on the fin, which may be a silicon-capping layer.

The fin structure 202 is formed using any suitable process comprising various deposition, photolithography, and/or etching processes. An exemplary photolithography process may include forming a photoresist layer (resist) overlying the substrate 20 (e.g., on a silicon layer), exposing the resist to a pattern, performing a post-exposure bake process, and developing the resist to form a masking element including the resist. The silicon layer may then be etched using reactive ion etching (RIE) processes and/or other suitable processes. In an example, silicon fins of the fin structure 202 may be formed using patterning and etching a portion of the silicon substrate 20. In another example, silicon fins of the fin structure 202 may be formed using patterning and etching a silicon layer deposited overlying an insulator layer (for example, an upper silicon layer of a silicon-insulator-silicon stack of an SOI substrate). In still other embodiments, the fin structure is formed by forming a dielectric layer above a substrate, opening trenches in the dielectric layer, and epitaxially growing fins from the substrate in the trenches to form the fins.

In the depicted embodiment, isolation regions are formed within the substrate 20 to define and electrically isolate the various fins of the fin structure 202. In one example, the isolation regions include shallow trench isolation (STI) regions 204 (comprising 204a and 204b). The isolation regions may comprise silicon oxide, silicon nitride, silicon oxynitride, fluoride-doped silicate glass (FSG), a low-K dielectric material, and/or combinations thereof. The isolation regions, and in the present embodiment, the STI regions 204, may be formed by any suitable process. As one example, the formation of the STI regions 204 may include filling trenches between the fins (for example, using a chemical vapor deposition process) with a dielectric material. In some embodiments, the filled trench may have a multi-layer structure such as a thermal oxide liner layer filled with silicon nitride or silicon oxide.

Still referring to FIG. 2, a gate stack 210 is formed on the major surface 20s of the substrate 20 (i.e., a top surface of the fin structure 202) in between the STI regions 204. Although in the plane illustrated in the Figures, gate stack 210 extends only on the top surface of the fin, those skilled in the art will recognize that in another plane of the device (not shown in the drawings) gate stack 210 extends along the sidewalls of fin structure 202. In some embodiments, the gate stack 210 comprises a gate dielectric layer 212 and a gate electrode layer 214 over the gate dielectric layer 212. In some embodiments, a pair of sidewall spacers 216 is formed on two sides of the gate stack 210. In the depicted embodiment, the gate stack 210 may be formed using any suitable process, including the processes described herein.

In one example, the gate dielectric layer 212 and gate electrode layer 214 are sequentially deposited over the substrate 20. In some embodiments, the gate dielectric layer 212 may include silicon oxide, silicon nitride, silicon oxy-nitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 212 is a high-k dielectric layer with a thickness in the range of about 10 angstroms to about 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the fin structure 202. The interfacial layer may comprise silicon oxide.

In some embodiments, the gate electrode layer 214 may comprise a single-layer or multilayer structure. In at least one embodiment, the gate electrode layer 214 comprises poly-silicon. Further, the gate electrode layer 214 may be doped poly-silicon with the uniform or non-uniform doping. In an alternative embodiment, the gate electrode layer 214 comprises a metal selected from a group of W, Cu, Ti, Ag, Al, TiAl, TiAlN, TaC, TaCN, TaSiN, Mn, and Zr. In an alternative embodiment, the gate electrode layer 214 comprises a metal selected from a group of TiN, WN, TaN, and Ru. In the present embodiment, the gate electrode layer 214 comprises a thickness in the range of about 30 nm to about 60 nm. The gate electrode layer 214 may be formed using a suitable process such as ALD, CVD, PVD, plating, or combinations thereof.

Then, a layer of photoresist (not shown) is formed over the gate electrode layer 214 by a suitable process, such as spin-on coating, and patterned to form a patterned photoresist feature by a proper lithography patterning method. In at least one embodiment, a width of the patterned photoresist feature is in the range of about 5 nm to about 45 nm. The patterned photoresist feature can then be transferred using a dry etching process to the underlying layers (i.e., the gate electrode layer 214 and the gate dielectric layer 212) to form the gate stack 210. The photoresist layer may be stripped thereafter.

Still referring to FIG. 2, the semiconductor device 200 further comprises a dielectric layer formed over the gate stack 210 and the substrate 20 and covering sidewalls of the gate stack 210. The dielectric layer may include silicon oxide, silicon nitride, or silicon oxy-nitride. The dielectric layer may comprise a single layer or multilayer structure. The dielectric layer may be formed by CVD, PVD, ALD, or other suitable technique. The dielectric layer comprises a thickness ranging from about 5 nm to about 15 nm. Then, an anisotropic etching is performed on the dielectric layer to form the pair of sidewall spacers 216 on two sides of the gate stack 210.

Figure 3:
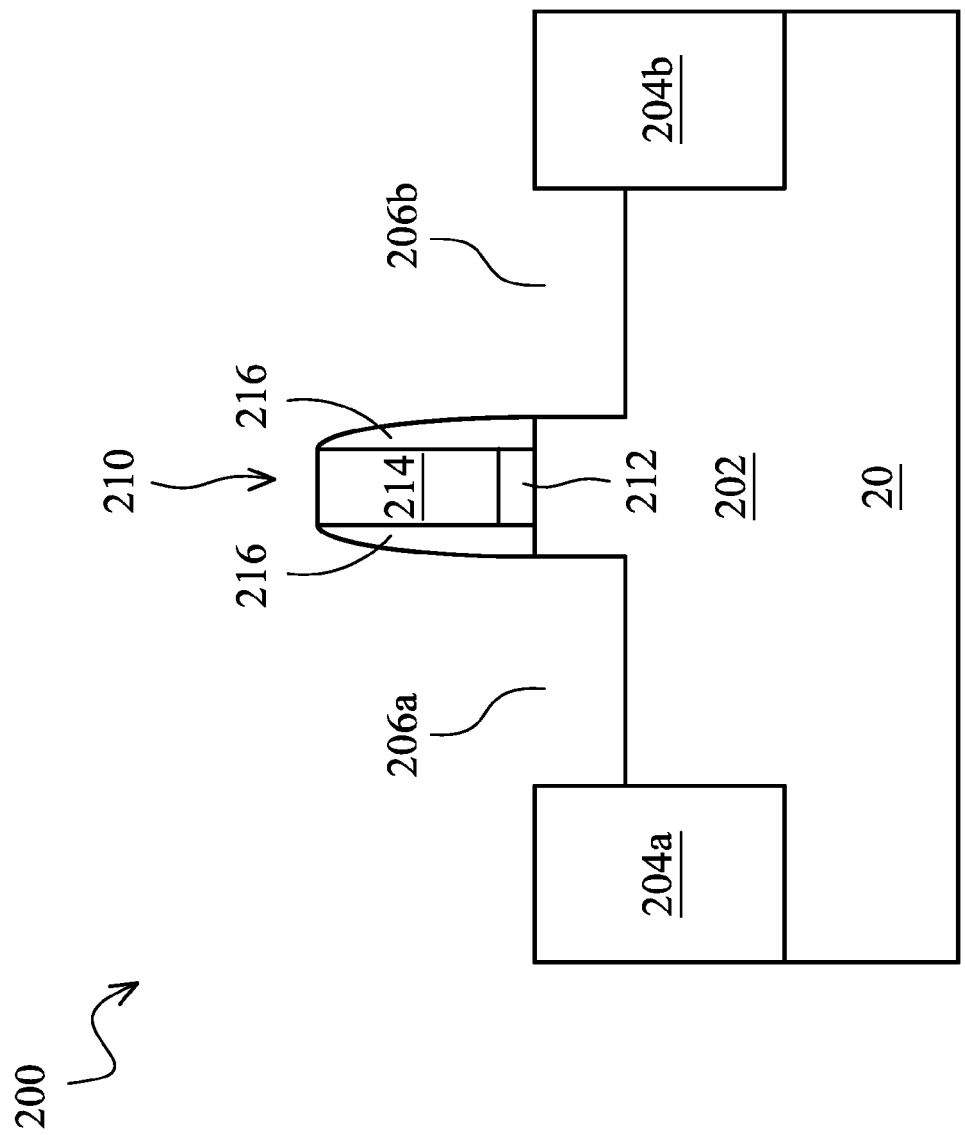

Referring to FIG. 3 and step 102 in FIG. 1, portions of the fin structure 202 (other than where the gate stack 210 and the pair of sidewall spacers 216 are formed thereover) are recessed to form source and drain (S/D) trenches 206 (comprising 206a and 206b) below the major surface 20s of the substrate 20 adjacent to the gate stack 210. In the depicted embodiment, each of the S/D trenches 206 is between the gate stack 210 and one of the STI regions 204. As such, the S/D trench 206a is adjacent to the gate stack 210, while the STI region 204a is disposed on a side of the S/D trench 206a opposite the gate stack 210. As such, the S/D trench 206b is adjacent to the gate stack 210, while the STI region 204b is disposed on a side of the S/D trench 206b opposite the gate stack 210.

In the depicted embodiment, using the gate stack 210 and the pair of sidewall spacers 216 as hard masks, a biased etching process is performed to recess the major surface 20s of the substrate 20 that are unprotected or exposed to form the S/D trenches 206. In one embodiment, the etching process may be performed under a pressure of about 1 mTorr to about 1000 mTorr, a power of about 50 W to about 1000 W, a bias voltage of about 20 V to about 500 V, at a temperature of about 40° C. to about 60° C., using a HBr and/or $Cl_2$ as etch gases. Also, in the embodiments provided, the bias voltage used in the etching process may be tuned to allow better control of an etching direction to achieve desired profiles for the S/D trenches 206.

Figure 4:
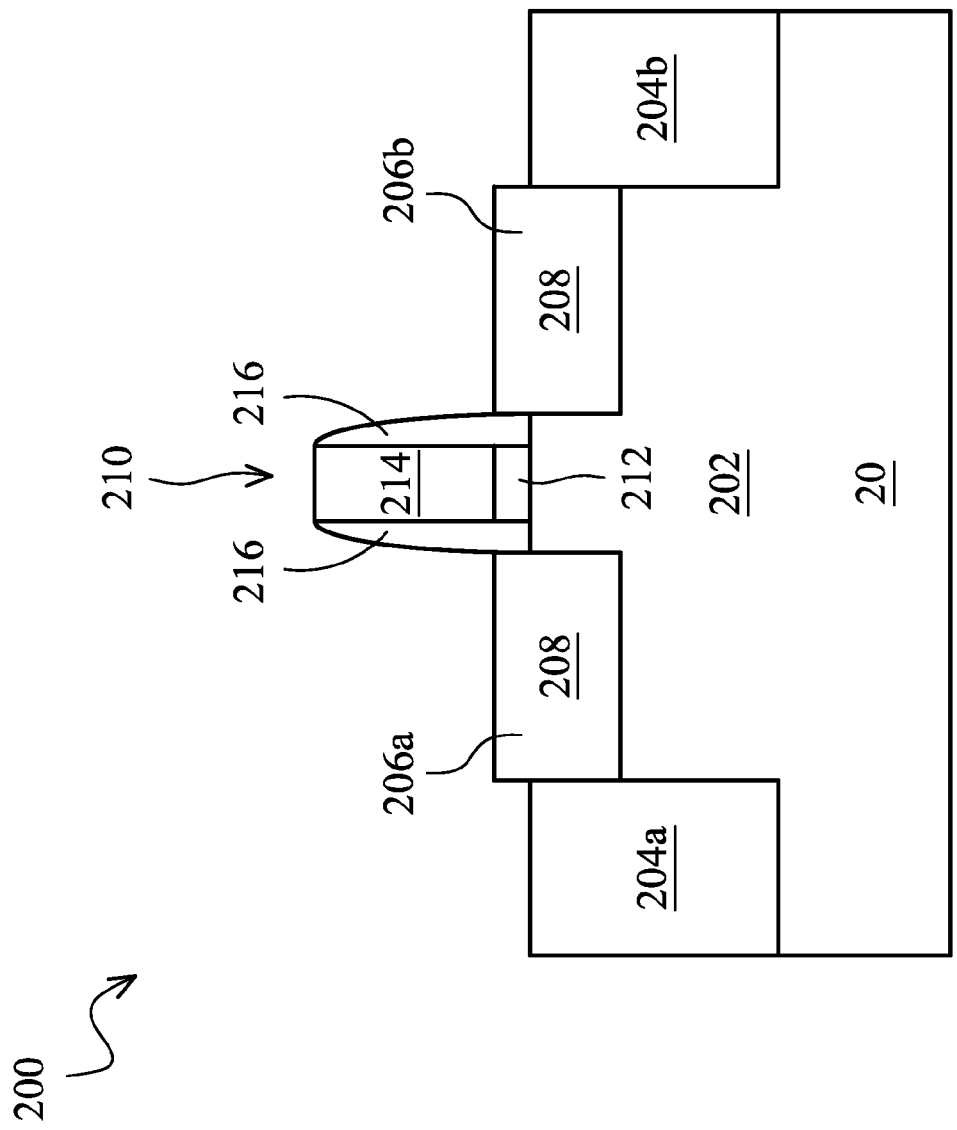

As depicted in FIG. 4 and step 104 in FIG. 1, after the formation of the S/D trenches 206 below the major surface 20s of the substrate 20, the structure in FIG. 4 is produced by epi-growing a strained material 208 in the S/D trench 206, wherein a lattice constant of the strained material 208 is different from a lattice constant of the substrate 20. Thus, the channel region of the semiconductor device 200 is strained or stressed to enhance carrier mobility of the device.

In some embodiments, the strained material 208 comprises Si, Ge, SiGe, SiC, SiP, or III-V semiconductor material. In the depicted embodiment, a pre-cleaning process may be performed to clean the S/D trenches 206 with HF or other suitable solution. Then, the strained material 208 such as silicon germanium (SiGe) is selectively grown by a low-pressure CVD (LPCVD) process to fill the S/D trenches 206. In one embodiment, an upper surface of the strained material 208 is lower than the major surface 20s (not shown). In another embodiment, the strained material 208 filling the S/D trenches 206 extends upward over the major surface 20s. In the depicted embodiment, the LPCVD process is performed at a temperature of about 400 to about 800° C. and under a pressure of about 1 to about 15 Ton, using $SiH_2Cl_2$, HCl, $GeH_4$, $B_2H_6$, and $H_2$ as reaction gases.

The process steps up to this point have provided the substrate 20 having the strained material 208 in the S/D trenches 206. In some applications, silicide regions over the strained material 208 may be formed by blanket depositing a thin layer of metal material, such as nickel, titanium, cobalt, and combinations thereof. The substrate 20 is then heated, which causes silicon to react with the metal where contacted. After the reaction, a layer of metal silicide is formed between the silicon-containing material and the metal. The un-reacted metal is selectively removed through the use of an etchant that attacks the metal material but does not attack silicide. However, Fermi level pinning between the metal silicide and strained material 208 results in a fixed Schottky barrier height (SBH). This fixed SBH causes high contact resistance of S/D regions of the semiconductor device and thus degrades the device performance.

Accordingly, the processing discussed below with reference to FIGS. 5-12 may form a contact structure comprising a conductive dielectric layer to replace the silicide regions. The conductive dielectric layer may serve as a low-resistance intermediate layer to replace high-resistance metal silicide. As such, the contact structure may provide low contact resistance of S/D regions of the semiconductor device, thereby enhancing the device performance.

Figure 5:
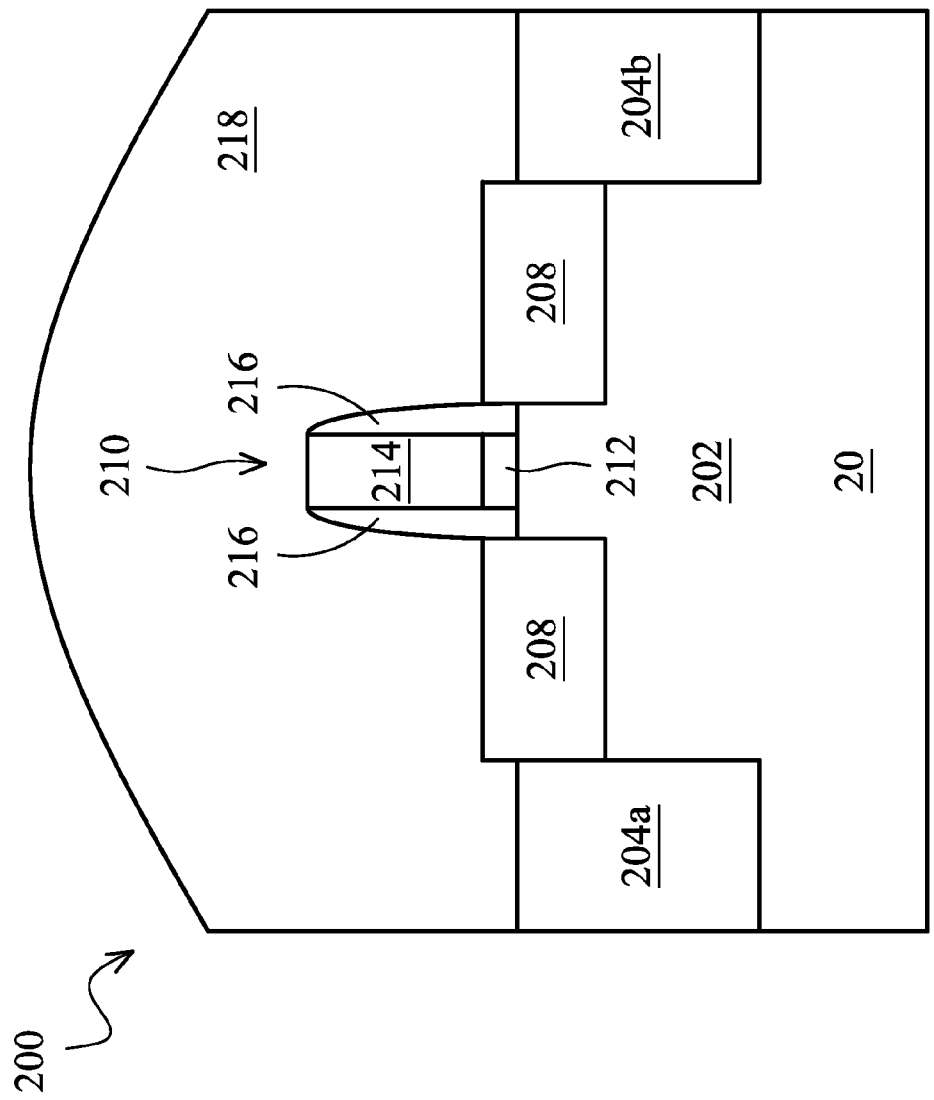
Figure 6:
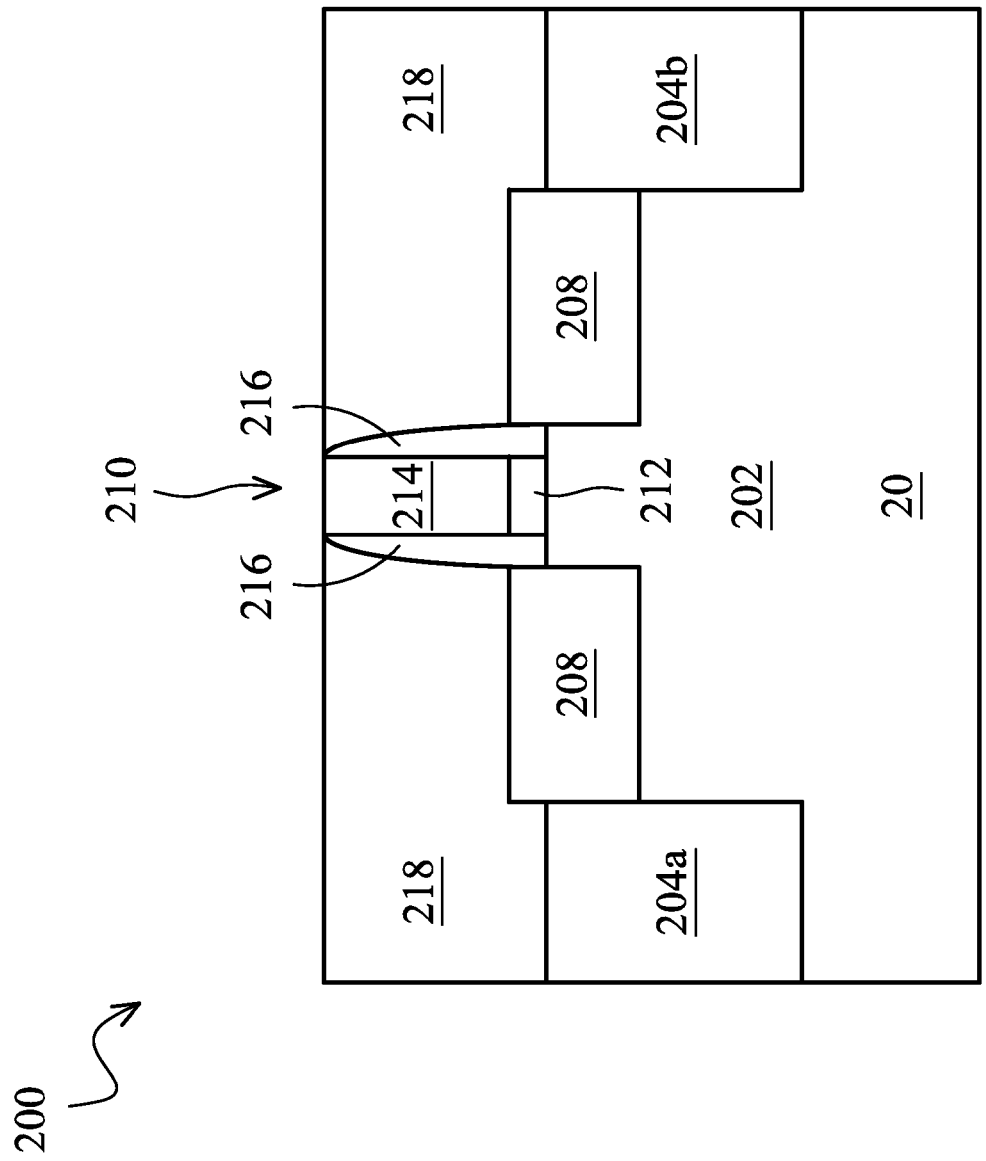

As depicted in FIGS. 5 and 6 and step 106 in FIG. 1, for fabricating a contact structure (such as a contact structure 234 shown in FIG. 12) of the semiconductor device 200, the structure in FIG. 5 is produced by forming an inter-layer dielectric (ILD) layer 218 over the strained material 208, the gate stack 210, the pair of sidewall spacers 216 and the isolation regions 204.

The ILD layer 218 comprises a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), and/or combinations thereof. In some embodiments, the ILD layer 218 may be formed over the strained material 208 by CVD, high density plasma (HDP) CVD, sub-atmospheric CVD (SACVD), spin-on, sputtering, or other suitable methods. In the present embodiment, the ILD layer 218 has a thickness in the range of about 4000 Å to about 8000 Å. It is understood that the ILD layer 218 may comprise one or more dielectric materials and/or one or more dielectric layers.

Subsequently, the ILD layer 218 is planarized using a CMP process until a top surface of the gate electrode layer 214 is exposed or reached (shown in FIG. 6). The CMP process has a high selectivity to provide a substantially planar surface for the gate electrode layer 214 and ILD layer 218.

Figure 7:
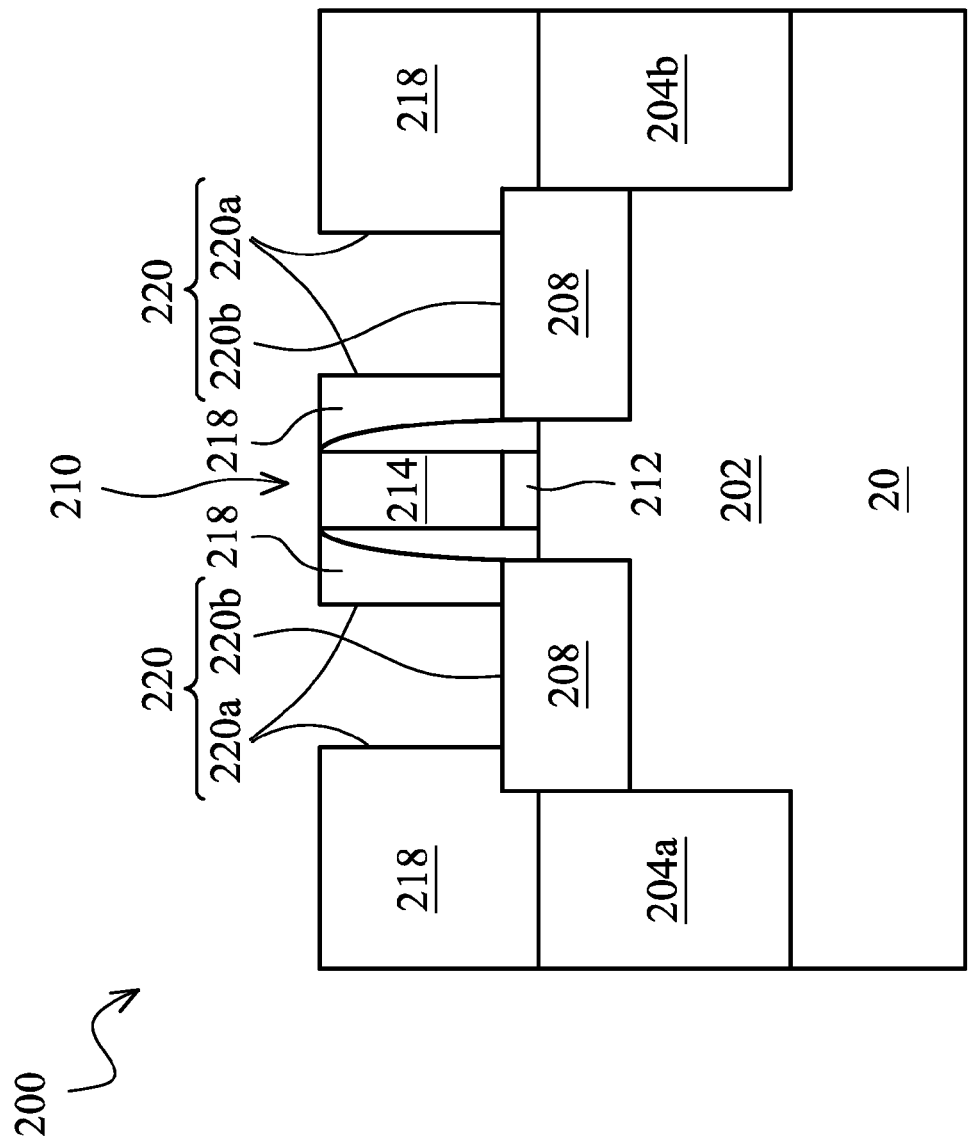

Subsequent CMOS processing steps applied to the semiconductor device 200 of FIG. 6 comprise forming contact opening through the ILD layer 218 to provide electrical contacts to S/D regions of the semiconductor device 200. Referring to FIG. 7, the structure in FIG. 7 is produced by forming an opening 220 in the ILD layer 218 to expose a portion of the strained material 208 (step 108 in FIG. 1). As one example, the formation of the opening 220 includes forming a layer of photoresist (not shown) over the ILD layer 218 by a suitable process, such as spin-on coating, patterning the layer of photoresist to form a patterned photoresist feature by a proper lithography method, etching the exposed ILD layer 218 (for example, by using a dry etching, wet etching, and/or plasma etching process) to remove portions of the ILD layer 218 to expose a portion of the strained material 208. As such, the opening 220 is over the strained material 208, wherein the opening 220 comprises dielectric sidewalls 220a and a strained material bottom 220b. The patterned photoresist layer may be stripped thereafter.

Figure 8:
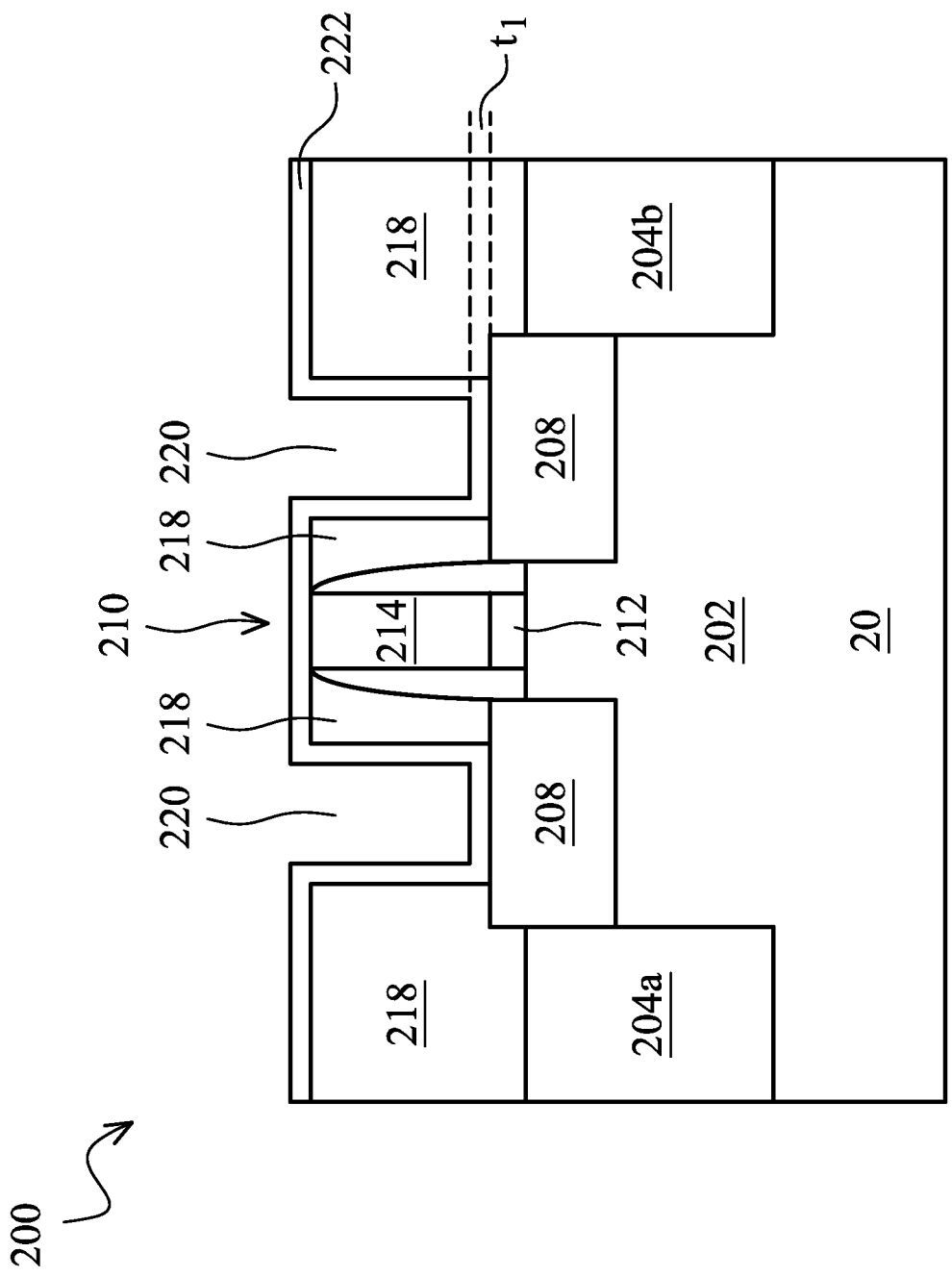

Referring to FIG. 8 and step 110 in FIG. 1, after formation of the opening 220 in the ILD layer 218, the structure in FIG. 8 is produced by forming a semiconductor oxide layer 222 on interior of the opening 220 and extending over the ILD layer 218 and the gate stack 210. In some embodiments, the semiconductor oxide layer 222 may comprise silicon oxide or germanium oxide, and may be formed using a method such as CVD, ALD or sputtering. In some embodiments, the semiconductor oxide layer 222 has a first thickness $t_1$ ranging from about 0.6 nm to about 3 nm.

Figure 9:
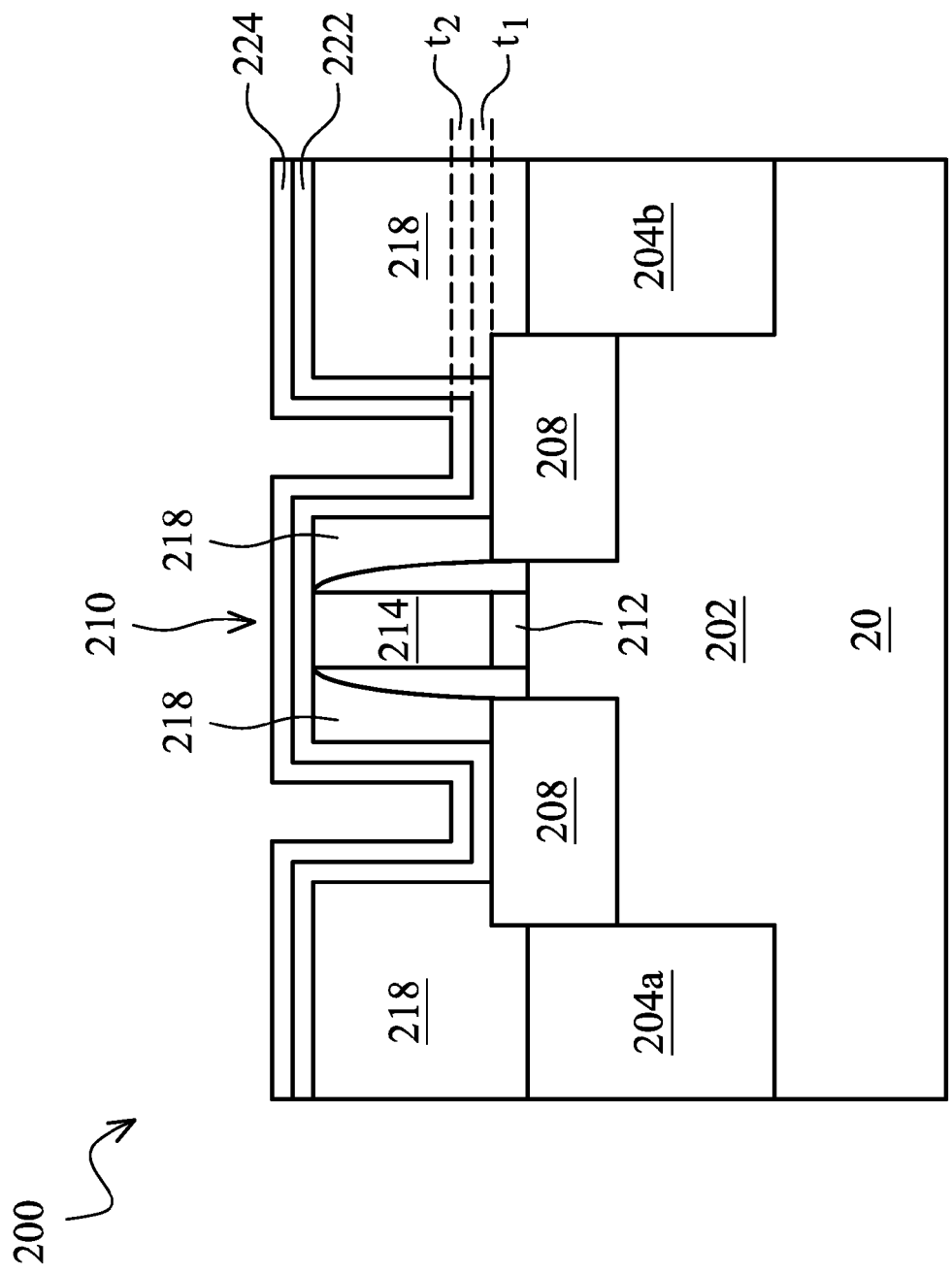

Referring to FIG. 9 and step 112 in FIG. 1, following formation of the semiconductor oxide layer 222 on interior of the opening 220, the structure in FIG. 9 is produced by forming a first metal layer 224 over the semiconductor oxide layer 222. In some embodiments, the first metal layer 224 may comprise Ti, Al, Zr, Hf, Ta, In, Ni, Be, Mg, Ca, Y, Ba, Sr, Sc, or Ga, and may be formed using a method such as CVD, ALD or sputtering. In some embodiments, the first metal layer 224 has a second thickness $t_2$ ranging from about 0.5 nm to about 4 nm.

Figure 10:
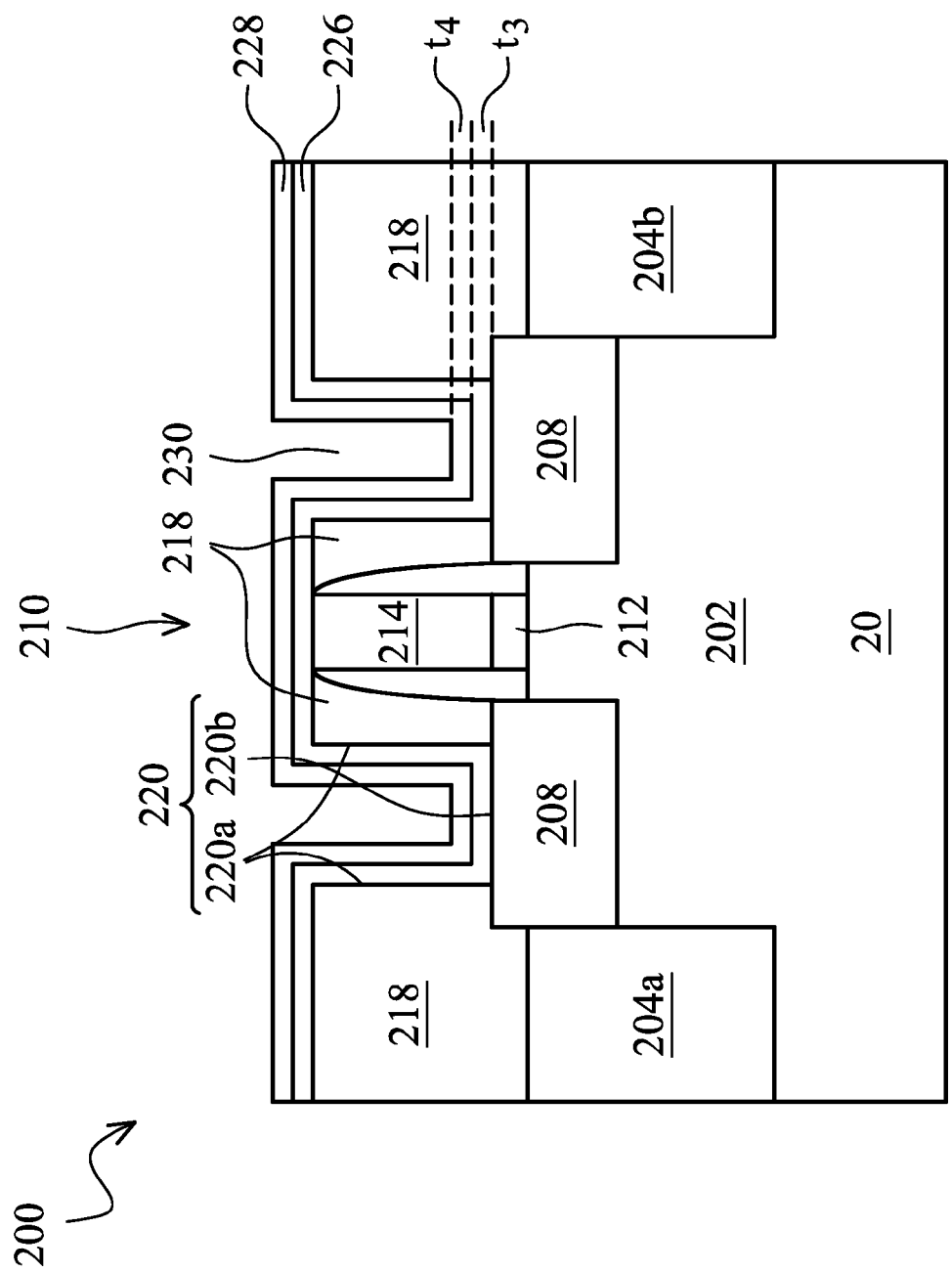

Referring to FIG. 10 and step 114 in FIG. 1, subsequent to the formation of the first metal layer 224 over the semiconductor oxide layer 222, the structures in FIG. 10 is produced by heating the substrate 20 to form a semiconductor layer 226 and a dielectric layer 228 over the semiconductor layer 226.

In some embodiments, the semiconductor layer 226 comprises Si or Ge. In some embodiments, the semiconductor layer 226 has a third thickness $t_3$ ranging from 0.3 nm to 1.5 nm. In some embodiments, the dielectric layer 228 partially filling the opening 220 has an opening 230. In some embodiments, the dielectric layer 228 has a fourth thickness $t_4$ ranging from about 1 nm to about 10 nm, making the dielectric layer 228 conductive. While the teaching of this disclosure is not limited to a specific theory of operation, it is believed that at the disclosed thickness range, dielectric layer 228 is a conductive dielectric layer because of tunneling current. As such, the dielectric layer 228 is referred to as a conductive dielectric layer 228 hereafter. In at least one embodiment, the conductive dielectric layer 228 comprises TiO or $TiO_2$. In an alternative embodiment, the conductive dielectric layer 228 comprises $Al_2O_3$. In an alternative embodiment, the conductive dielectric layer 228 is selected from an oxide of the group consisting of Zr, Hf, Ta, In, Ni, Be, Mg, Ca, Y, Ba, Sr, Sc, Ga, and mixtures thereof. In the depicted embodiment, the conductive dielectric layer 228 may reduce the fixed SBH and serve as a low-resistance intermediate layer to replace high-resistance metal silicide, thereby enhancing the device performance.

Thermodynamically, the semiconductor layer 226 is more stable than the first metal layer 224 in an oxygen-containing environment. As such, the first metal layer 224 may convert the semiconductor oxide layer 222 in contact therewith to form the semiconductor layer 226, while the first metal layer 224 is oxidized to form the conductive dielectric layer 228 over the semiconductor layer 226. In the depicted embodiment, the semiconductor layer 226 is on the sidewalls 220a and bottom 220b of the opening 220. In some embodiments, the step of heating the substrate 20 is performed by exposing the substrate 20 to an inert gas, at a temperature of about 200° C. to about 800° C. In some embodiments, the inert gas comprises $N_2$, He, or Ar.

Figure 11:
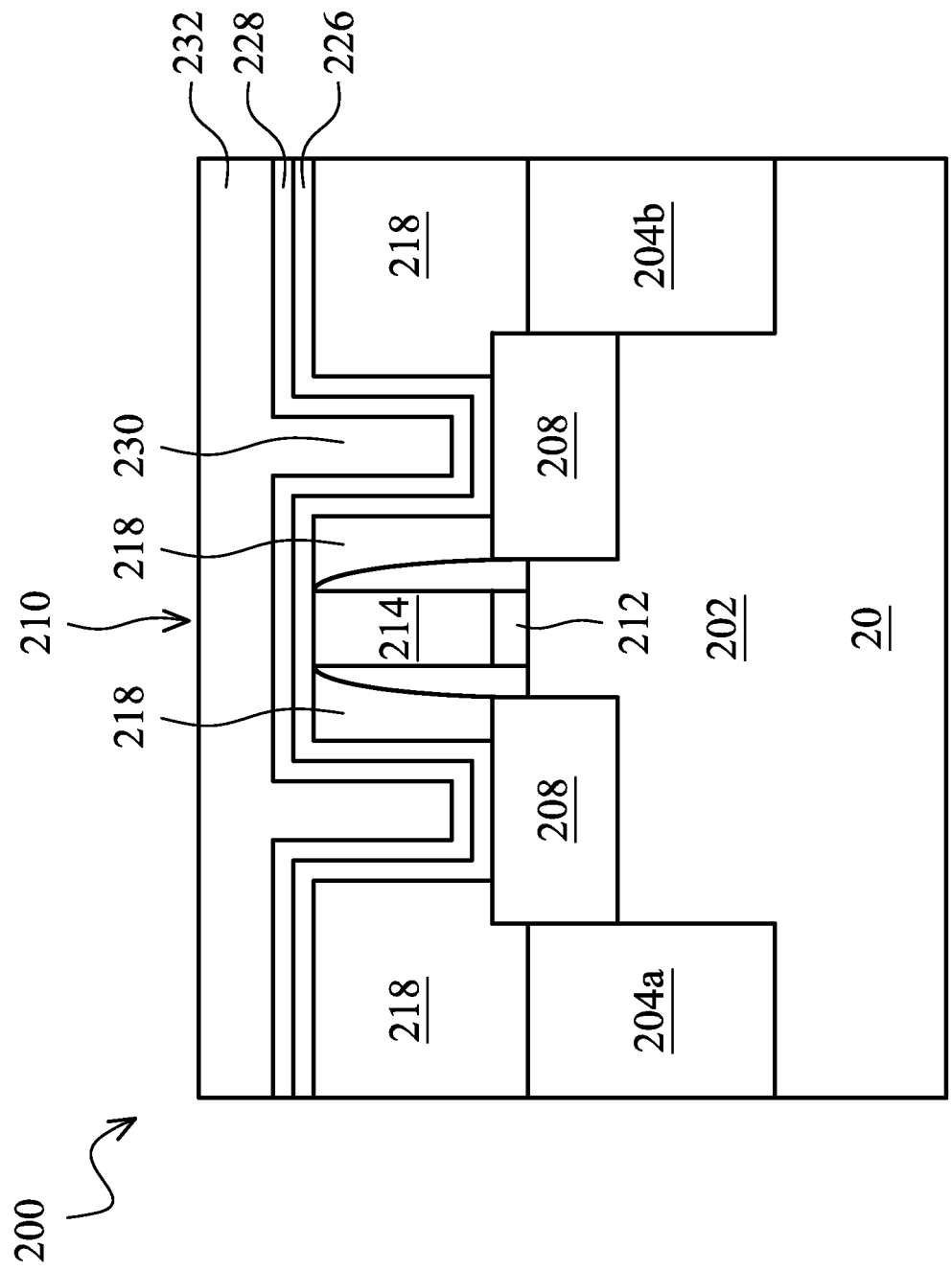
Figure 12:
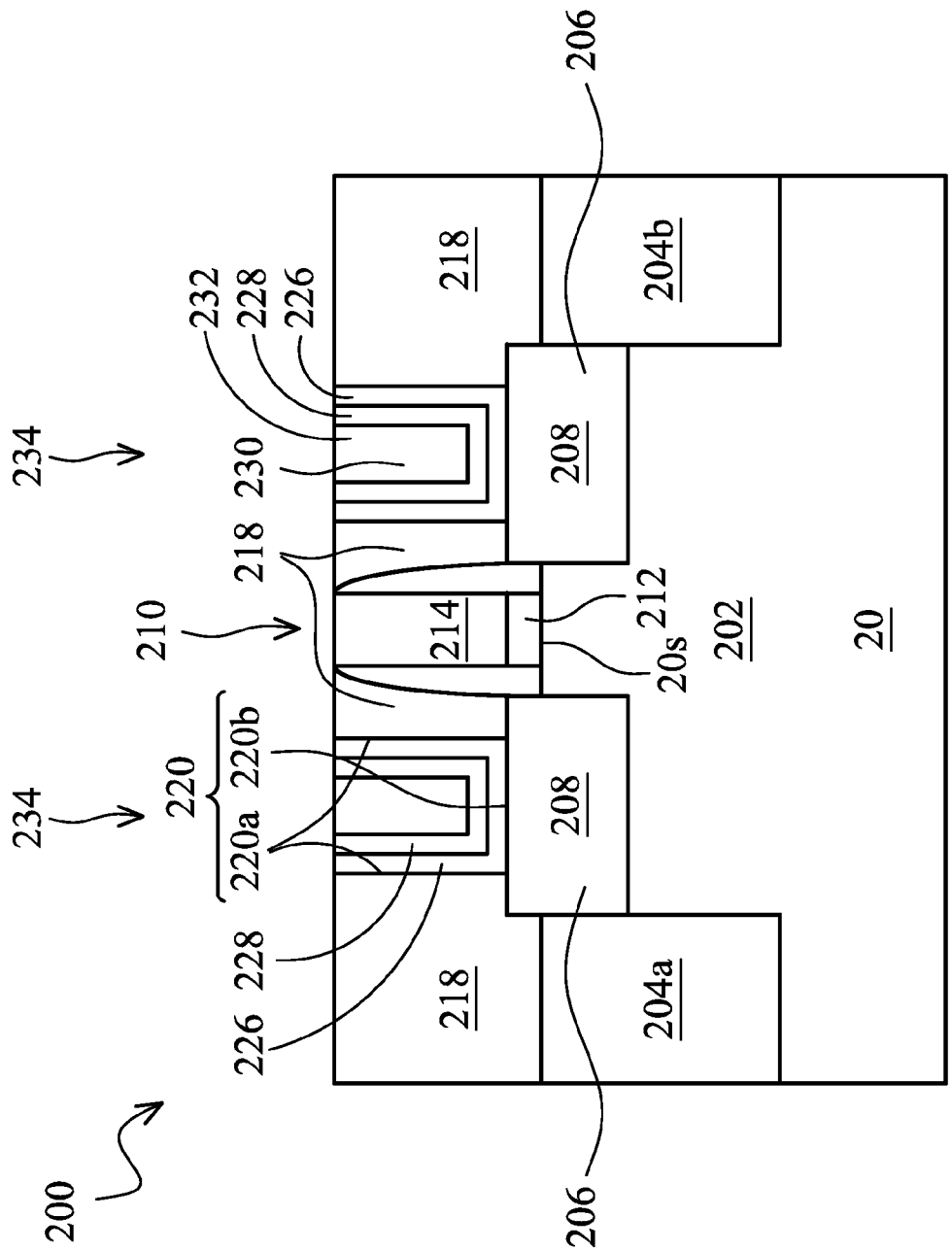

Referring to FIGS. 11 and 12 and step 116 in FIG. 1, following formation of the conductive dielectric layer 228, the structures in FIG. 11 is produced by forming a second metal layer 232 in the opening 230 of the dielectric layer 228. In the depicted embodiment, the second metal layer 232 is deposited over the conductive dielectric layer 228 to fill the opening 230 of the conductive dielectric layer 228. In some embodiments, the second metal layer 232 comprises Ta, Ti, Hf, Zr, Ni, W, Co, Cu, or Al. In some embodiments, the second metal layer 232 may be formed by CVD, PVD, plating, ALD, or other suitable technique. In some embodiment, the second metal layer 232 may comprise a laminate. The laminate may further comprise a barrier metal layer, a liner metal layer or a wetting metal layer. Further, the thickness of the second metal layer 232 will depend on the depth of the opening 230. The second metal layer 232 is thus deposited until the opening 230 are substantially filled or over-filled.

Then, another CMP is performed to planarize the second metal layer 232 after filling the opening 230 (shown in FIG. 12). Since the CMP removes a portion of the second metal layer 232 outside of the opening 230, the CMP process may stop when reaching the ILD layer 218, and thus providing a substantially planar surface.

In some embodiments, with respect to the example depicted in FIG. 12, the contact structure 234 for the semiconductor device 200 comprises the substrate 20 comprising the major surface 20s and the trench 206 below the major surface 20s; the strained material 208 filling the trench 206, wherein a lattice constant of the strained material 208 is different from a lattice constant of the substrate 20; the ILD layer 218 having the opening 220 over the strained material 208, wherein the opening 220 comprises the dielectric sidewalls 220a and the strained material bottom 220b; the semiconductor layer 226 on the sidewalls 220a and bottom 220b of the opening 220; the dielectric layer 228 on the semiconductor layer 226; and the metal layer 232 filling the opening 230 of the dielectric layer 228.

In the depicted embodiment, the gate stack 210 is fabricated using a gate-first process. In an alternative embodiment, the gate stack 210 may be fabricated using a gate-last process performed by first forming a dummy gate stack. In some embodiments, the gate-last process comprises forming an ILD layer surrounding the dummy gate stack, removing a dummy gate electrode layer to form a trench in the ILD layer, then filling the trench with a conductive gate electrode layer. In some embodiments, the gate-last process comprises forming an ILD layer surrounding the dummy gate stack, removing a dummy gate electrode layer and a dummy gate dielectric layer to form a trench in the ILD layer, then filling the trench with a gate dielectric layer and a conductive gate electrode layer.

After the steps shown in FIG. 1, as further illustrated with respect to the example depicted in FIGS. 2-12, have been performed, subsequent processes, comprising interconnect processing, are performed to complete the semiconductor device 200 fabrication. It has been observed that the contact structure 234 comprising a conductive dielectric layer 228 may provide a low-resistance path for interconnection, thus upgrading the device performance.

In accordance with embodiments, a contact structure for a semiconductor device comprises a substrate comprising a major surface and a trench below the major surface; a strained material filling the trench, wherein a lattice constant of the strained material is different from a lattice constant of the substrate; an inter-layer dielectric (ILD) layer having an opening over the strained material, wherein the opening comprises dielectric sidewalls and a strained material bottom; a semiconductor layer on the sidewalls and bottom of the opening; a dielectric layer on the semiconductor layer; and a metal layer filling an opening of the dielectric layer.

In accordance with another embodiments, a metal oxide semiconductor field effect transistor (MOSFET) comprises a substrate comprising a major surface; a gate stack on the major surface of the substrate; a trench below the major surface adjacent to the gate stack; a shallow trench isolations (STI) region disposed on a side of the trench opposite the gate stack, wherein the STI region is within the substrate; and a contact structure comprising a strained material filling the trench, wherein a lattice constant of the strained material is different from a lattice constant of the substrate; an inter-layer dielectric (ILD) layer having an opening over the strained material, wherein the opening comprises dielectric sidewalls and a strained material bottom; a semiconductor layer on the sidewalls and bottom of the opening, wherein the semiconductor layer has a thickness ranging from 0.3 nm to 1.5 nm; a dielectric layer on the semiconductor layer, wherein the dielectric layer has a thickness ranging from 1 nm to 10 nm; and a metal layer filling an opening of the dielectric layer.

In accordance with another embodiments, a method of fabricating a semiconductor device comprises providing a substrate comprising a major surface and a trench below the major surface; epi-growing a strained material in the trench, wherein a lattice constant of the strained material is different from a lattice constant of the substrate; forming an inter-layer dielectric (ILD) layer over the strained material; forming an opening in the ILD layer to expose a portion of the strained material; forming a semiconductor oxide layer on interior of the opening and extending over the ILD layer; forming a first metal layer over the semiconductor oxide layer; heating the substrate to form a semiconductor layer and a dielectric layer over the semiconductor layer; and forming a second metal layer in an opening of the dielectric layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A contact structure for a semiconductor device comprising:
    a substrate comprising a major surface and a trench below the major surface;
    a strained material filling the trench, wherein a lattice constant of the strained material is different from a lattice constant of the substrate;
    an inter-layer dielectric (ILD) layer having an opening over the strained material, wherein the opening comprises dielectric sidewalls and a strained material bottom;
    a semiconductor layer on the sidewalls and bottom of the opening;
    a dielectric layer on the semiconductor layer; and
    a metal layer filling an opening of the dielectric layer.

2. The contact structure of claim 1, wherein the semiconductor layer has a thickness ranging from 0.3 nm to 1.5 nm.

3. The contact structure of claim 1, wherein the dielectric layer has a thickness ranging from 1 nm to 10 nm.

4. The contact structure of claim 1, wherein the strained material comprises Si, Ge, SiGe, SiC, SiP, or III-V semiconductor material.

5. The contact structure of claim 1, wherein the semiconductor layer comprises Si or Ge.

6. The contact structure of claim 1, wherein the dielectric layer comprises TiO or $TiO_2$.

7. The contact structure of claim 1, wherein the dielectric layer comprises $Al_2O_3$.

8. The contact structure of claim 1, wherein the dielectric layer is selected from an oxide of the group consisting of Zr, Hf, Ta, In, Ni, Be, Mg, Ca, Y, Ba, Sr, Sc, Ga, and mixtures thereof.

9. The contact structure of claim 1, wherein the metal layer comprises Ta, Ti, Hf, Zr, Ni, W, Co, Cu, or Al.

10. A metal oxide semiconductor field effect transistor (MOSFET) comprising:
    a substrate comprising a major surface;
    a gate stack on the major surface of the substrate;
    a trench below the major surface adjacent to the gate stack;
    a shallow trench isolations (STI) region disposed on a side of the trench opposite the gate stack, wherein the STI region is within the substrate; and
    a contact structure comprising
    a strained material filling the trench, wherein a lattice constant of the strained material is different from a lattice constant of the substrate;
    an inter-layer dielectric (ILD) layer having an opening over the strained material, wherein the opening comprises dielectric sidewalls and a strained material bottom;
    a semiconductor layer on the sidewalls and bottom of the opening, wherein the semiconductor layer has a thickness ranging from 0.3 nm to 1.5 nm;
    a dielectric layer on the semiconductor layer, wherein the dielectric layer has a thickness ranging from 1 nm to 10 nm; and
    a metal layer filling an opening of the dielectric layer.

11. The MOSFET of claim 10, wherein the strained material comprises Si, Ge, SiGe, SiC, SiP, or III-V semiconductor material.

12. The MOSFET of claim 10, wherein the semiconductor layer comprises Si or Ge.

13. The MOSFET of claim 10, wherein the dielectric layer comprises TiO or $TiO_2$.

14. The MOSFET of claim 10, wherein the dielectric layer comprises $Al_2O_3$.

15. The MOSFET of claim 10, wherein the dielectric layer is selected from an oxide of the group consisting of Zr, Hf, Ta, In, Ni, Be, Mg, Ca, Y, Ba, Sr, Sc, Ga, and mixtures thereof.

16. The MOSFET of claim 10, wherein the metal layer comprises Ta, Ti, Hf, Zr, Ni, W, Co, Cu, or Al.

* * * * *